(12) United States Patent
Arndt et al.

(10) Patent No.: US 10,768,067 B2
(45) Date of Patent: Sep. 8, 2020

(54) LID WITH EMBEDDED WATER DETECTION AND HEATER

(71) Applicant: Apple Inc., Cupertino, CA (US)

(72) Inventors: Gregory B. Arndt, San Jose, CA (US); Jiahui Liang, Sunnyvale, CA (US); Ashwin Balasubramanian, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 192 days.

(21) Appl. No.: 16/114,070

(22) Filed: Aug. 27, 2018

(65) Prior Publication Data

US 2020/0064215 A1 Feb. 27, 2020

(51) Int. Cl.
*G01L 9/12* (2006.01)
*H01L 23/34* (2006.01)
*H01L 23/64* (2006.01)
*G01R 27/26* (2006.01)
*G01L 1/14* (2006.01)

(52) U.S. Cl.
CPC .............. *G01L 9/12* (2013.01); *H01L 23/345* (2013.01); *H01L 23/642* (2013.01); *G01L 1/148* (2013.01); *G01R 27/2635* (2013.01); *H01L 2924/1811* (2013.01)

(58) Field of Classification Search
CPC ......... G01L 9/12; G01L 1/148; H01L 23/345; H01L 23/642
See application file for complete search history.

(56) References Cited

U.S. PATENT DOCUMENTS

| | | | |
|---|---|---|---|
| 2011/0239784 A1* | 10/2011 | Ohsato | G01P 15/123 73/862.044 |
| 2019/0265114 A1* | 8/2019 | Lai | G01D 18/00 |

* cited by examiner

*Primary Examiner* — Jamel E Williams
(74) *Attorney, Agent, or Firm* — Morgan, Lewis & Bockius LLP

(57) ABSTRACT

An apparatus with embedded water detection and heater includes a substrate including a number of conductive traces and a lid including multiple electrodes. Each electrode is coupled to at least one of the conductive traces through vias. A sensor is placed inside a cavity of the lid and is electrically coupled to one or more conductive traces of the substrate. A gel at least partially fills the lid and covers the sensor. The presence of water on the apparatus is detected by measuring a dielectric permittivity between at least two of the plurality of electrodes, and the electrodes can generate heat to eliminate the water.

20 Claims, 6 Drawing Sheets

US 10,768,067 B2

LID WITH EMBEDDED WATER DETECTION AND HEATER

TECHNICAL FIELD

The present description relates generally to sensor technology, and more particularly, to a lid with embedded water detection and heater.

BACKGROUND

Portable communication devices (e.g., smart phones and smart watches) are becoming increasingly equipped with environmental sensors such as pressure, temperature and humidity sensors, gas sensors and particulate matter (PM) sensors. For example, a pressure sensor can enable health and fitness features in a smart watch or a smart phone. A measured pressure can then be converted (e.g., by a processor) to other parameters related to pressure, for example, elevation, motion, flow, or other parameters. Pressure sensors can be used to measure pressure in a gas or liquid environment.

Pressure sensors can vary drastically in technology, design, performance and application. In terms of employed technologies, pressure sensors can be categorized as, for example, piezoelectric, capacitive, electromagnetic, optical, or potentiometric pressure sensors. The micro-electro-mechanical system (MEMS) type pressure sensors used in smart phones or smart watches are generally capacitive-type pressure sensors. Pressure sensors using interim gel have been widely used in the microelectronic devices, but the gel can be susceptible to environmental contaminations and water occlusion. There is a need for pressure sensors that can detect presence of water on the gel and facilitate its elimination.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in a block diagram form in order to avoid obscuring the concepts of the subject technology.

The subject technology is directed to an apparatus for detecting water on a sensor device and eliminating the water via heating. In one or more implementations, the apparatus of the subject technology includes a substrate having a number of conductive traces. A lid including two or more electrodes houses a sensor. Each electrode is coupled to at least one of the conductive traces through vias. The sensor is electrically coupled to one or more conductive traces of the substrate. A gel at least partially fills the lid and covers the sensor. Presence of water on the apparatus is detected by measuring the electrical impedance between at least two of the electrodes. The electrodes can eliminate the water through heating.

Figure 1:
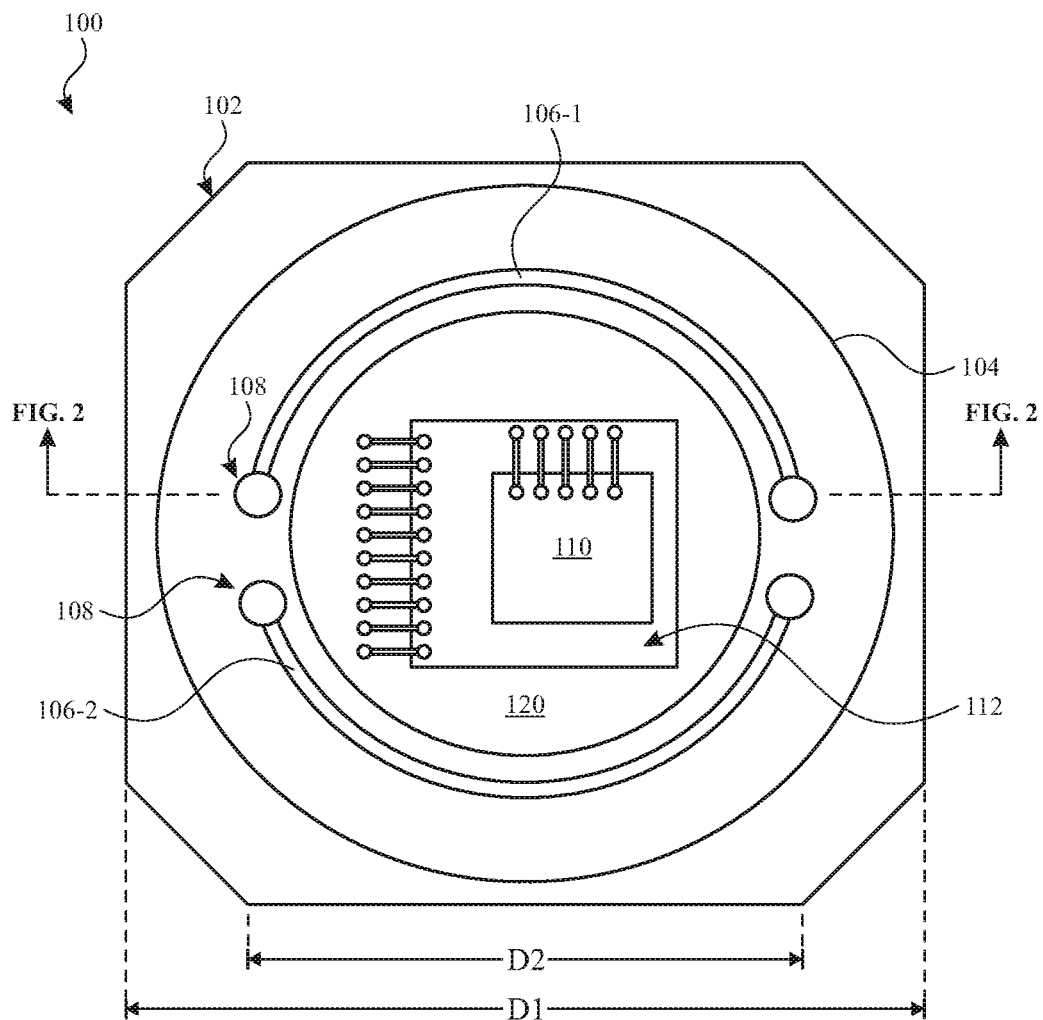
FIG. 1 is a diagram illustrating a top view of an example device with embedded water detection and heater, in accordance with one or more aspects of the subject technology.

FIG. 1 is a diagram illustrating a top view of an example device 100 with embedded water detection and heater, in accordance with one or more aspects of the subject technology. Device 100 can be a miniature device with dimensions on the order of a few mm that is suitable for embedding in a wearable communication device such as a smart phone or a smart watch. For example, dimensions D1 and D2, as shown in FIG. 1, can be about 3.5 and 2.4 mm, respectively. The device 100, as shown in the top view of FIG. 1, includes, but is not limited to, a substrate 102, a lid 104, electrodes 106 (e.g., 106-1 and 106-2), vias 108, a sensor 110, an integrated circuit 112, and a gel 120. The substrate 102 can be a semiconductor substrate, a flex, a print circuit board (PCB), or other types of substrate. In some implementations, the lid 104 can be made by an injection molding of a polymer, for example, a plastic to suitably insulate the electrodes 106 and the vias 108. The polymer and/or plastic material used for the lid 104 can be a low-creep plastic/polymer such as liquid crystal polymer with high tensile stress that can stand high temperatures within a range of about 180° C.-200° C.

In one or more implementations, the electrodes 106 can be made of nickel-phosphate (NiP), nickel-chromium (NiCr), or other suitable materials, compounds, or alloys that are able to reach a temperature within a range of about 100° C.-150° C. The number of electrodes 106 is not limited to the two electrodes 106-1 and 106-2 shown in FIG. 1, and can be four or more separate electrodes. In some implementations, the electrodes 106 are embedded in a top surface of the lid 104 and are electrically connected to conductor traces of the substrate 102 through vias 108. Each electrode (e.g., 106-1) can be connected to two vias 108. The sensor 110 can be a pressure sensor, for example, a micro-electromechanical system (MEMS) pressure sensor. The sensor 110 can be mounted or implemented on a semiconductor chip including the integrated circuit 112, which is wire bonded to one or more conductive traces of the substrate 102.

The lid 104 can be at least partially filled with a gel to protect the sensor 110 and the integrated circuit 112 from moisture and other damaging pollutants. In one or more implementations, the presence of water on the apparatus (e.g., on the gel 120 and/or the lid 104) is detected by measuring a capacitance between one of the electrodes 106 and a ground connected metal housing of the apparatus. In some implementations, the presence of water on the apparatus is detected by measuring a dialectic permittivity between two of the electrodes 106, for example, under control of a processor such as a processor of a host device. The host device can be a wearable communication device such as a smart phone or a smart watch. Once the presence of water is detected, the electrodes 106 can generate heat to eliminate the water by evaporation. The electrodes can heat up to more than 100° C., under the control of the processor.

Figure 2:
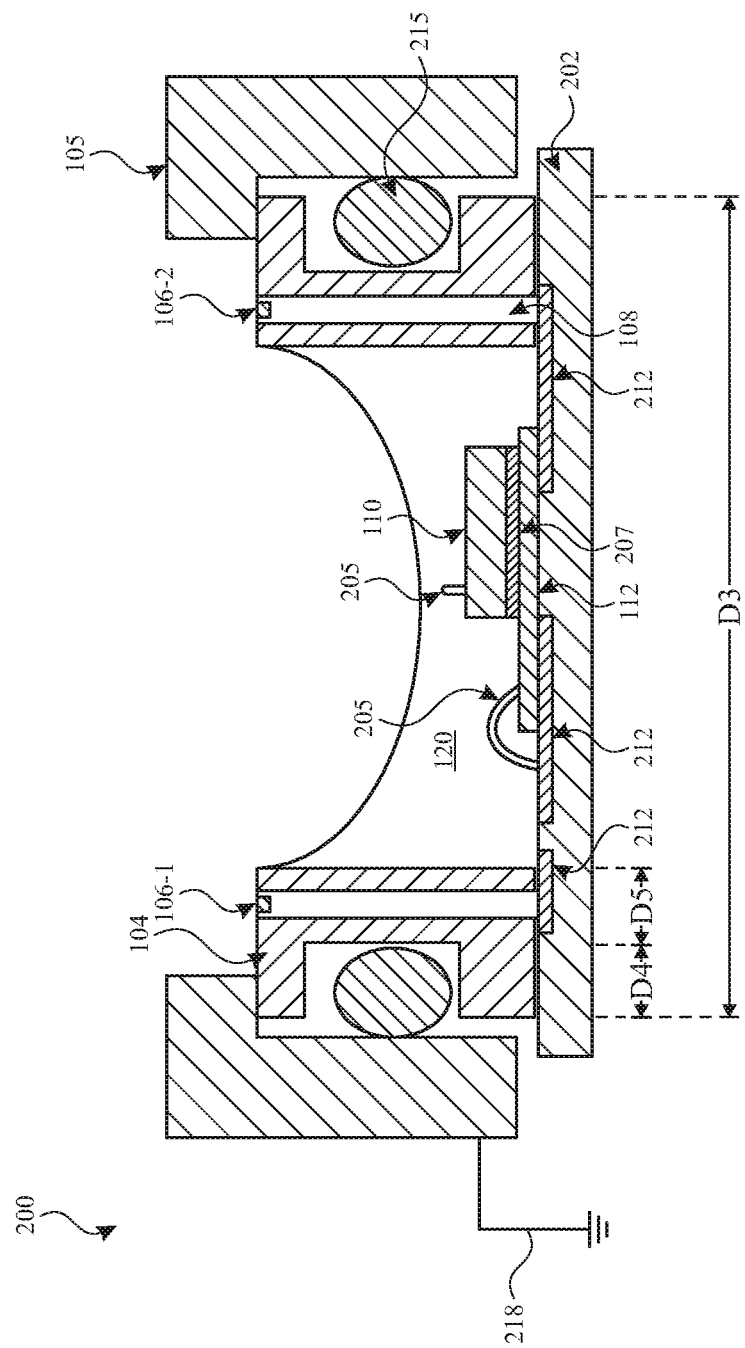
FIG. 2 is a diagram illustrating a cross-sectional view of an example device with embedded water detection and heater, in accordance with one or more aspects of the subject technology.

FIG. 2 is a diagram illustrating a cross-sectional view 200 of an example device with embedded water detection and heater, in accordance with one or more aspects of the subject technology. The cross-sectional view 200 depicts a cross section of the device 100 of FIG. 1 across a line AA'. The cross-sectional view 200 shows the lid 104 surrounded by a housing 105, which can be a metal housing connected to a ground potential 218. The housing 105 is isolated from the lid 104 via an O-ring 215. As shown in the cross-sectional view 200, the electrodes 106-1 and 106-2 are embedded on the top of the lid 104 and are connected to conductive traces 212 of the substrate 202. The gel 120 covers the sensor 110, the integrated circuit 112, and the corresponding wire bonds 205. The wire bonds 205 connect the sensor 110 to the integrated circuit 112, to which the sensor is adhered via an adhesion layer 207. The wire bonds 205 also connect the integrated circuit 112 to one or more conductive traces 212 of the substrate 202. The cross-sectional view 200 also shows dimensions D3, D4, and D5, the values of which are about 3.3 mm, 0.3 mm and 0.3 mm, respectively.

Figure 3A:
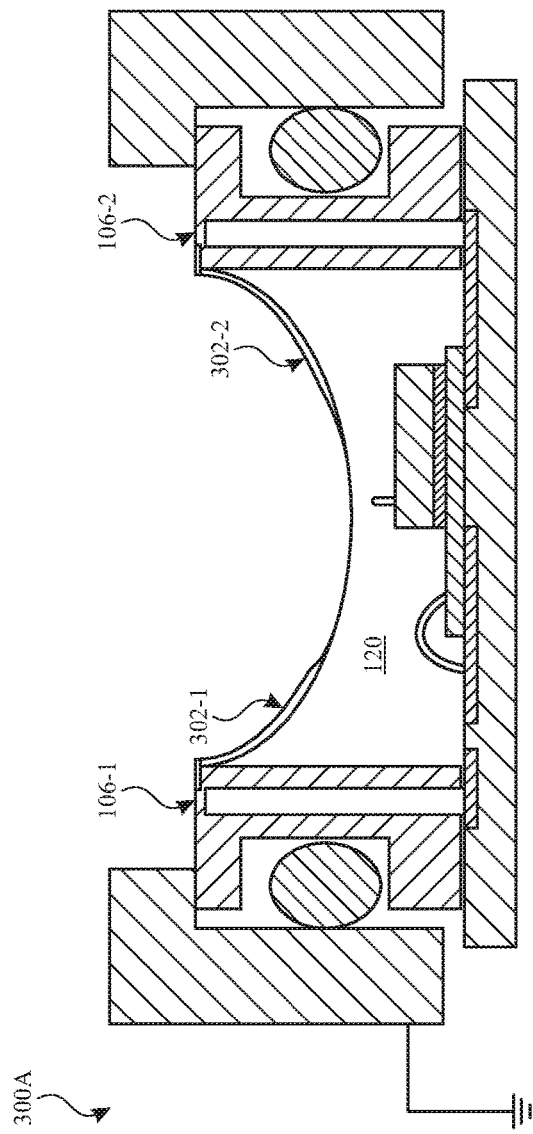
FIGS. 3A through 3C are diagrams illustrating various views of an example device with embedded water detection and heater, in accordance with one or more aspects of the subject technology.
Figure 3C:
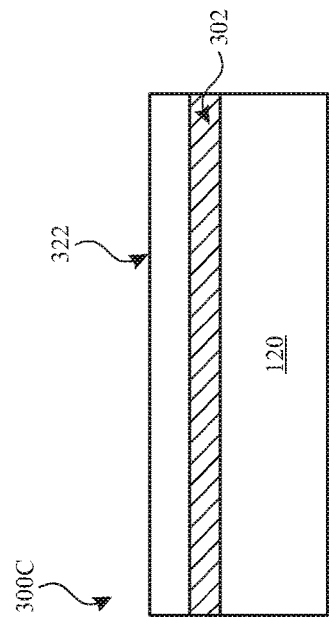
Figure 3B:
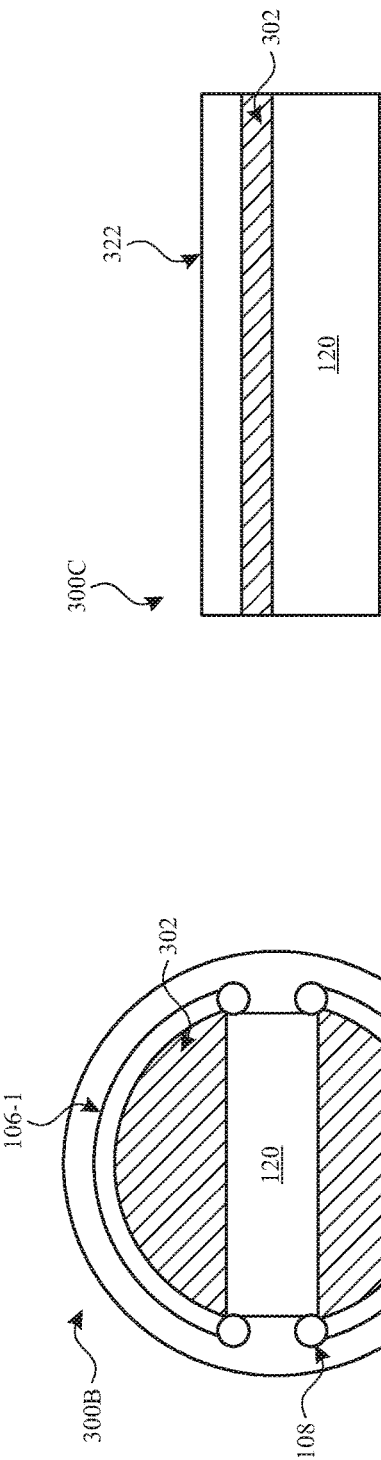

FIGS. 3A through 3C are diagrams illustrating various views of an example device with embedded water detection and heater, in accordance with one or more aspects of the subject technology. The various views shown in FIGS. 3A through 3C are a cross-sectional view 300A, a top view 300B, and a cross-sectional view 300C of one or more implementations of the gel. The cross-sectional view 300A is similar to the cross-sectional view 200 of FIG. 2 of the device 100 of FIG. 1, with the exception of depicting a conductive layer 322 on the gel 120. The conductive layer 302 can be coated on the gel 120, for example, by a uniform spray of a suitable conductive layer, such as silver, aluminum, gold, titanium, or other conductors. The conductive layer 302 (e.g., 302-1 and 302-2) can be coated on a portion of the gel 120, for example, by masking a middle portion of gel 120. The conductive layer 302 can be an extension of the electrodes 106 (e.g., 106-1 and 106-2), so that it can be used in the processes of water detection and/or heating.

The top view 300B, shown in FIG. 3B, shows the conductive layer 302 coated on a portion of the gel 120 and an exposed middle portion that is not covered by the conductive layer 302. The conductive layer 302 can be in contact with (connected to) the electrodes 106. In one or more implementations, the conductive layer 302 can be covered over an entire surface of the gel but not be connected to the electrodes 106. In these implementations, the conductive layer 302, which is isolated from the electrodes 106, can be connected through a separate via (other than 108) (not shown in FIG. 3B for simplicity) to conductive traces 212 of the substrate 202 of FIG. 2, and a capacitance between the isolated conductive layer 302 and a ground potential (e.g., 218) can be used to detect a presence of water on the device.

The cross-sectional view 300C of FIG. 3C shows an additional layer 302 of gel covering the conductive layer 302, which can be implemented in some embodiments, to protect the conductive layer 302. In these implementations, the conductive layer 302 can only be used to assist in heating and eliminating water and not in water detection.

Figure 4:
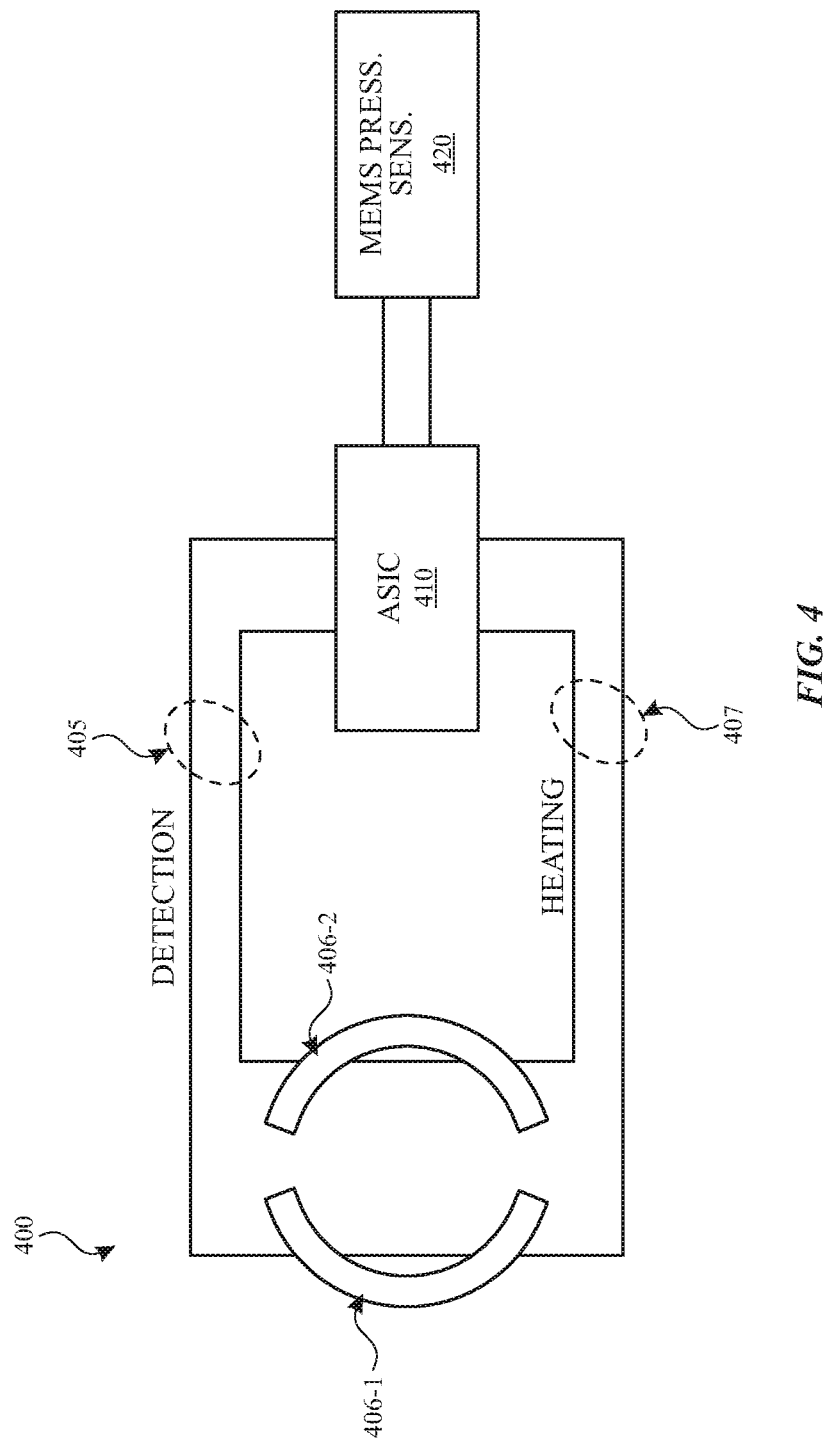
FIG. 4 is a block diagram illustrating an apparatus with embedded water detection and heater, in accordance with one or more aspects of the subject technology.

FIG. 4 is a block diagram illustrating an apparatus 400 with embedded water detection and heater, in accordance with one or more aspects of the subject technology. The apparatus 400 includes electrodes 406, an application specific integrated circuit (ASIC) 410, and a MEMS pressure sensor 420. The electrodes 406 (e.g., 406-1 and 406-2) represent the electrodes 106 (e.g., 106-1 and 106-2) of FIGS. 1 and 2. The ASIC 410 and the MEMS pressure sensor 420 are represented by the integrated circuit 112 and the sensor 110 of FIG. 1. The electrodes 406-1 and 406-2 are coupled via connections 405 and 407 to the ASIC 410 and the MEMS pressure sensor is connected (e.g., through wire bonds 205 of FIG. 2) to the ASIC 410.

The connections 405 and 407 are used for water detection and heating as discussed above. For example, the connections 405 can be used to feed an alternating voltage v(t) to the electrodes 406 and measure a resulting current via the ASIC 410. The measured value of the resulting current i would be a measure of the capacitance C between the two electrodes 406 (i=C dv/dt). The capacitance C would be different when there is water on the apparatus (e.g., device 100 of FIG. 1), as the water can change a dielectric permittivity between the electrodes 406, which is leverage to detect a presence of water on the device. Once the presence of water is detected, the water can be evaporated by heating through a current provided by the connections 407. In some implementations, one set of connections can be used for water detection and heating, as the two processes do not have to be performed simultaneously. In one or more implementations, the ASIC 410 can be part of the circuitry of a host device, such as a wearable communication device (e.g., a smart phone or a smart watch).

Figure 5:
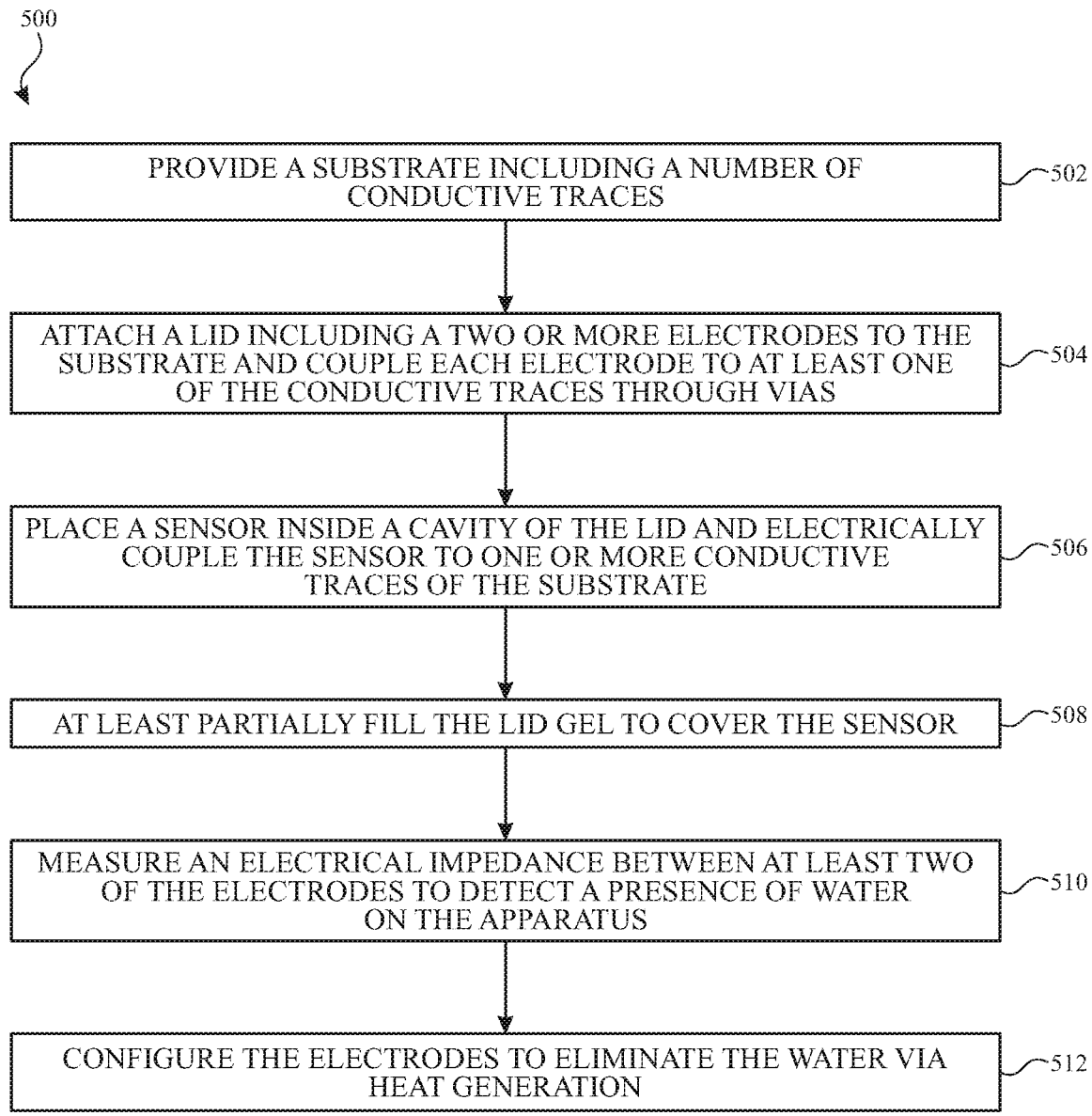
FIG. 5 is a flow diagram illustrating an example method for providing of an apparatus with embedded water detection and heater, in accordance with one or more aspects of the subject technology.

FIG. 5 is a flow diagram illustrating an example method 500 for providing of an apparatus with embedded water detection and heater, in accordance with one or more aspects of the subject technology. The method 500 begins with providing a substrate (e.g., 102 of FIG. 1 or 202 of FIG. 2), including a number of conductive traces (e.g., 212 of FIG. 2) (502). A lid (e.g., 104 of FIG. 1 or FIG. 2) including a two or more electrodes (e.g., 106-1 and 106-2 of FIG. 1 or 2) is attached to the substrate, and each electrode is coupled to at least one of the conductive traces (e.g., 212 of FIG. 2) through vias (e.g., 108 of FIG. 1 or 2) (504). A sensor (e.g., 110 of FIG. 1 or 2) is placed inside a cavity of the lid and the sensor is electrically coupled (e.g., via wire bonds 205 of FIG. 2) to one or more conductive traces of the substrate (506). The lid is at least partially filled with a gel (e.g., 120 of FIG. 1 or FIG. 2) to cover the sensor (508). An electrical impedance between at least two of the electrodes (e.g., 406-1 and 406-2 of FIG. 4) is measured (e.g., by the ASIC 410 of FIG. 4) to detect a presence of water on the apparatus (510). The electrodes can eliminate the water via heat generation (via connections 407 of FIG. 4) (512).

Figure 6:
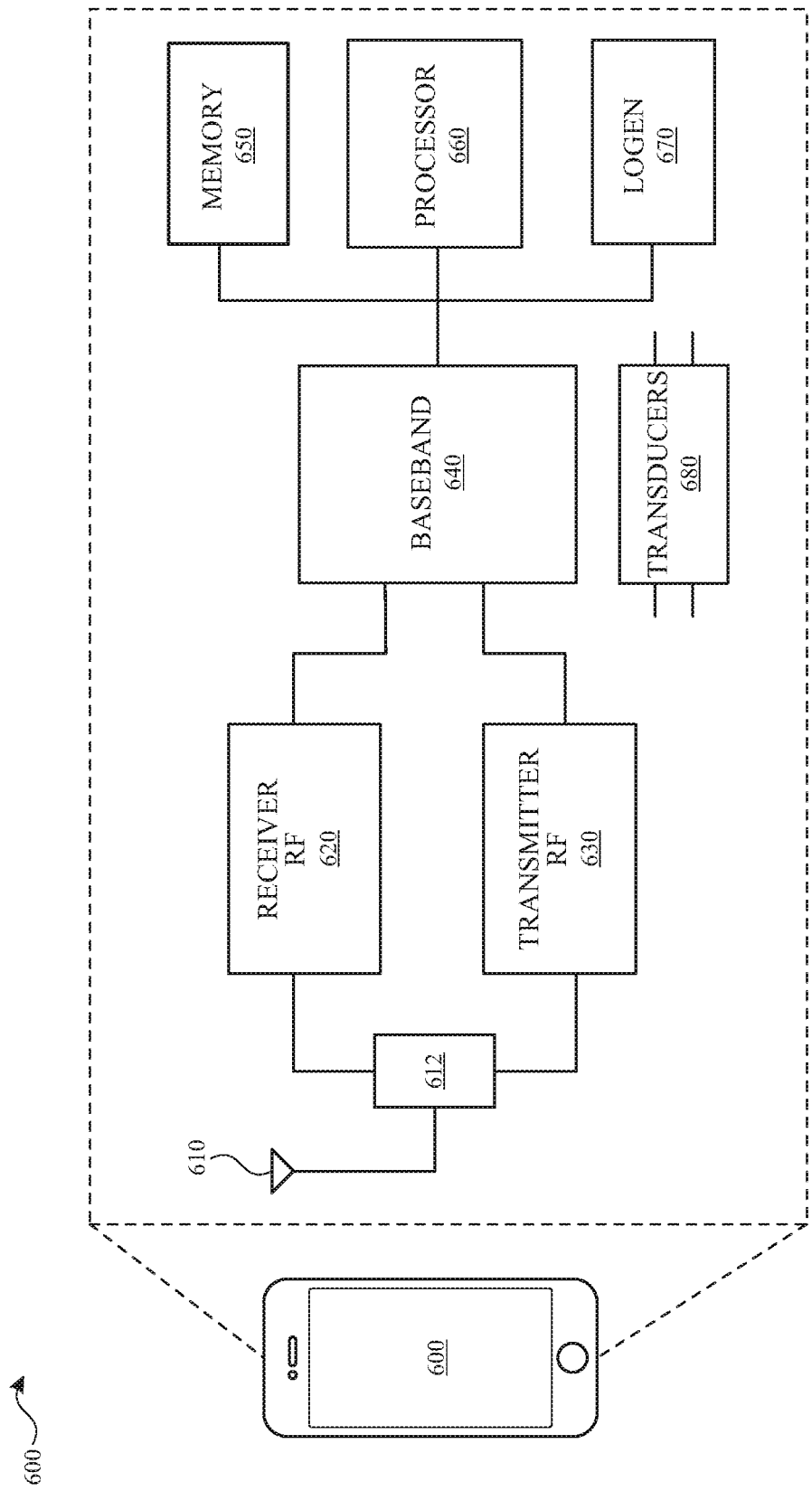
FIG. 6 is a block diagram illustrating a wireless communication device, within which one or more aspects of the subject technology can be implemented.

FIG. 6 is a block diagram illustrating a wireless communication device, within which one or more aspects of the subject technology can be implemented. In one or more implementations, the wireless communication device 600 can be a smart phone or a smart watch that hosts an apparatus of the subject technology including a sensor (e.g., a pressure sensor) and a lid with embedded water detection and heater. The wireless communication device 600 may comprise a radio-frequency (RF) antenna 610, a receiver 620, a transmitter 630, a baseband processing module 640, a memory 650, a processor 660, a local oscillator generator (LOGEN) 670, and one or more transducers 680. In various embodiments of the subject technology, one or more of the blocks represented in FIG. 6 may be integrated on one or more semiconductor substrates. For example, the blocks 620-670 may be realized in a single chip or a single system on a chip, or may be realized in a multi-chip chipset.

The receiver 620 may comprise suitable logic circuitry and/or code that may be operable to receive and process signals from the RF antenna 610. The receiver 620 may, for example, be operable to amplify and/or down-convert received wireless signals. In various embodiments of the subject technology, the receiver 620 may be operable to cancel noise in received signals and may be linear over a wide range of frequencies. In this manner, the receiver 620 may be suitable for receiving signals in accordance with a variety of wireless standards, Wi-Fi, WiMAX, Bluetooth, and various cellular standards. In various embodiments of the subject technology, the receiver 620 may not require any SAW filters and few or no off-chip discrete components such as large capacitors and inductors.

The transmitter 630 may comprise suitable logic circuitry and/or code that may be operable to process and transmit signals from the RF antenna 610. The transmitter 630 may, for example, be operable to up-convert baseband signals to RF signals and amplify RF signals. In various embodiments of the subject technology, the transmitter 630 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 630 may be operable to provide signals for further amplification by one or more power amplifiers.

The duplexer 612 may provide isolation in the transmit band to avoid saturation of the receiver 620 or damaging parts of the receiver 620, and to relax one or more design requirements of the receiver 620. Furthermore, the duplexer 612 may attenuate the noise in the receive band. The duplexer may be operable in multiple frequency bands of various wireless standards.

The baseband processing module 640 may comprise suitable logic, circuitry, interfaces, and/or code that may be operable to perform processing of baseband signals. The baseband processing module 640 may, for example, analyze received signals and generate control and/or feedback signals for configuring various components of the wireless communication device 600, such as the receiver 620. The baseband processing module 640 may be operable to encode, decode, transcode, modulate, demodulate, encrypt, decrypt, scramble, descramble, and/or otherwise process data in accordance with one or more wireless standards.

The processor 660 may comprise suitable logic, circuitry, and/or code that may enable processing data and/or controlling operations of the wireless communication device 600. In this regard, the processor 660 may be enabled to provide control signals to various other portions of the wireless communication device 600. The processor 660 may also control transfer of data between various portions of the wireless communication device 600. Additionally, the processor 660 may enable implementation of an operating system or otherwise execute code to manage operations of the wireless communication device 600. In one or more implementations, the processor 660 can be used to cause measuring of a dielectric permittivity between at least two of the electrodes of the device 100 of FIG. 1 to detect a presence of water on the device 100. The processor 660 can also cause the electrodes of the device 100 to generate heat to eliminate the water.

The memory 650 may comprise suitable logic, circuitry, and/or code that may enable storage of various types of information such as received data, generated data, code, and/or configuration information. The memory 650 may comprise, for example, RAM, ROM, flash, and/or magnetic storage. In various embodiments of the subject technology, information stored in the memory 650 may be utilized for configuring the receiver 620 and/or the baseband processing module 640.

The local oscillator generator (LOGEN) 670 may comprise suitable logic, circuitry, interfaces, and/or code that may be operable to generate one or more oscillating signals of one or more frequencies. The LOGEN 670 may be operable to generate digital and/or analog signals. In this manner, the LOGEN 670 may be operable to generate one or more clock signals and/or sinusoidal signals. Characteristics of the oscillating signals such as the frequency and duty cycle may be determined based on one or more control signals from, for example, the processor 660 and/or the baseband processing module 640.

In operation, the processor 660 may configure the various components of the wireless communication device 600 based on a wireless standard according to which it is desired to receive signals. Wireless signals may be received via the RF antenna 610, amplified, and down-converted by the receiver 620. The baseband processing module 640 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 650, and/or information affecting and/or enabling operation of the wireless communication device 600. The baseband processing module 640 may modulate, encode, and perform other processing on audio, video, and/or control signals to be transmitted by the transmitter 630 in accordance with various wireless standards.

In one or more implementations, the transducers 680 may include a miniature sensor such as the MEMS sensor (e.g., a pressure sensor) of the subject technology, for example, as shown in FIGS. 1 through 4 and described above. The device 100 of the subject technology can be readily integrated into the communication device 600, in particular, when the communication device 600 is a smart mobile phone or a smart watch. In one or more implementations, the processor 660 can process signals received from the electrode (e.g., 106 of FIG. 1 or 406 of FIG. 4) to detect presence of water on the device and cause the electrodes to generate heat to evaporate water.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus with embedded water detection and heater, the apparatus comprising:
    a substrate including a plurality of conductive traces;
    a lid including a plurality of electrodes, each electrode being coupled to at least one of the plurality of conductive traces through vias;
    a sensor placed inside a cavity of the lid and electrically coupled to one or more conductive traces of the plurality of conductive traces; and
    a gel at least partially filling the lid to cover the sensor, wherein a presence of water on the apparatus is detected by measuring a dielectric permittivity between at least two of the plurality of electrodes, and
    the plurality of electrodes are configured to eliminate the water via heat generation.

2. The apparatus of claim 1, wherein the lid comprises an injection molded lid made of a polymer.

3. The apparatus of claim 2, wherein the sensor comprises a micro-electromechanical system (MEMS) pressure sensor disposed on a semiconductor chip.

4. The apparatus of claim 1, wherein the plurality of electrodes comprises two or four separate electrodes embedded in a top surface of the lid.

5. The apparatus of claim 1, wherein the presence of the water on the apparatus is detected by measuring a capacitance between one of the electrodes and a ground connected metal housing.

6. The apparatus of claim 1, wherein the electrodes comprise nickel-phosphate (NiP) or nickel-chromium (NiCr) and are configured to reach a temperature within a range of about 100-150° C.

7. The apparatus of claim 1, wherein a top surface of the gel is covered at least partially with a coating, and wherein the coating comprises a heat conductive coating and is used to generate heat.

8. The apparatus of claim 7, wherein the coating is electrically conductive and is used to facilitate detecting of presence of water on the apparatus.

9. A communication device comprising:
    a processor; and
    a device with embedded water detection and heater, the device comprising:
        a substrate including a plurality of conductive traces;
        a lid including a plurality of electrodes coupled through respective vias to at least some of the plurality of conductive traces;
        a sensor disposed on a semiconductor chip electrically coupled to one or more conductive traces of the plurality of conductive traces; and
        a gel at least partially filling the lid to cover the sensor,
    wherein the processor is configured to cause:
        measuring a dielectric permittivity between at least two of the plurality of electrodes to detect a presence of water on the device, and
        generating heat by the plurality of electrodes to eliminate the water.

10. The communication device of claim 9, wherein the sensor comprises a micro-electromechanical system (MEMS) pressure sensor disposed on the semiconductor chip that is placed on the substrate.

11. The communication device of claim 9, wherein the lid comprises an injection molded lid made of a polymer, and wherein the respective vias are embedded within a wall thickness of the lid.

12. The communication device of claim 9, wherein the plurality of electrodes comprises two or four separate electrodes, wherein the electrodes are embedded in a top surface of the lid and are electrically connected to the respective vias.

13. The communication device of claim 9, wherein the processor is configured to cause measuring a capacitance between one of the electrodes and a ground connected metal housing to detect the presence of the water on the device.

14. The communication device of claim 9, wherein the electrodes comprise nickel-phosphate (NiP) or nickel-chromium (NiCr), and wherein the processor is configured to cause a temperature of the electrodes to reach within a range of about 100-150° C.

15. The communication device of claim 9, wherein a top surface of the gel is covered at least partially with a coating, and wherein the coating is a heat conductive coating and processor is configured to cause the heat conductive coating to generate heat for evaporating the water.

16. The communication device of claim 15, wherein the coating is electrically conductive, and wherein the processor is configured to cause the electrically conductive coating to detect presence of water on the device.

17. An apparatus comprising:
    an integrated circuit implemented on a semiconductor chip;

a lid including a plurality of electrodes, each electrode being coupled through vias to at least one of a plurality of conductive traces of a substrate;

a sensor disposed within a cavity of the lid and electrically coupled to the integrated circuit and to one or more conductive traces of the plurality of conductive traces; and a gel covering the sensor and at least partially filling the lid, wherein the integrated circuit is configured to detect a presence of water on the apparatus based on a measurement of a dielectric permittivity between at least two of the plurality of electrodes, and to eliminate the water by enabling the plurality of electrodes to generate heat.

18. The apparatus of claim 17, wherein the lid comprises an injection molded lid made of a polymer, and wherein the plurality of electrodes comprises two or four separate electrodes embedded in a top surface of the lid.

19. The apparatus of claim 17, wherein the integrated circuit is configured to detect the water on the apparatus based on a measurement of a capacitance between one of the electrodes and a ground connected metal housing.

20. The apparatus of claim 17, wherein a top surface of the gel is covered at least partially with a heat conductive coating thermally coupled with heat generating electrodes, wherein an additional gel layer covers the heat conductive coating.

* * * * *